United States Patent
Oberlaender

(10) Patent No.: US 9,818,492 B2
(45) Date of Patent: Nov. 14, 2017

(54) METHOD FOR TESTING A MEMORY AND MEMORY SYSTEM

(71) Applicant: Infineon Technologies AG, Neubiberg (DE)

(72) Inventor: Klaus Oberlaender, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 213 days.

(21) Appl. No.: 14/301,538

(22) Filed: Jun. 11, 2014

(65) Prior Publication Data

US 2014/0372814 A1    Dec. 18, 2014

(30) Foreign Application Priority Data

Jun. 13, 2013  (DE) .................. 10 2013 211 077

(51) Int. Cl.
| | | |
|---|---|---|
| *G11C 29/00* | (2006.01) | |
| *G11C 29/12* | (2006.01) | |
| *G11C 29/42* | (2006.01) | |
| *G11C 29/52* | (2006.01) | |
| *G06F 11/10* | (2006.01) | |
| *G11C 29/04* | (2006.01) | |

(52) U.S. Cl.
CPC .......... *G11C 29/12* (2013.01); *G06F 11/1048* (2013.01); *G11C 29/42* (2013.01); *G11C 29/52* (2013.01); *G11C 2029/0409* (2013.01); *G11C 2029/0411* (2013.01)

(58) Field of Classification Search
CPC ......... G11C 29/12; G11C 29/42; G11C 29/52; G11C 2029/0409; G11C 2029/0411; G06F 11/1048
See application file for complete search history.

(56) References Cited

U.S. PATENT DOCUMENTS

| | | | | |
|---|---|---|---|---|
| 4,661,995 A | * | 4/1987 | Kashiwagi ............. | H03D 7/163 455/183.2 |
| 5,644,583 A | * | 7/1997 | Garcia ................ | G06F 11/1044 714/764 |
| 6,799,391 B1 | * | 10/2004 | Bergholtz ................ | B42F 5/06 40/778 |
| 7,069,494 B2 | * | 6/2006 | Cargnoni .............. | H03M 13/13 714/763 |
| 8,145,977 B2 | | 3/2012 | Lee | |

(Continued)

FOREIGN PATENT DOCUMENTS

| | | |
|---|---|---|
| AT | 409562 B | 10/2008 |
| WO | 02075545 A1 | 9/2002 |

OTHER PUBLICATIONS

ST AN1823 Application Note, Error Correction code in NAND Flash memories, May 2004, pp. 1-14.*

(Continued)

*Primary Examiner* — Sam Rizk

(74) *Attorney, Agent, or Firm* — Eschweiler & Potashnik, LLC

(57) ABSTRACT

A method for testing a memory includes performing an error correction code check (ECC check) on user data stored in the memory, inverting the user data stored in the memory, performing a further ECC check on the inverted user data stored in the memory, and inverting the inverted user data stored in the memory for restoring the user data in the memory.

19 Claims, 3 Drawing Sheets

(56) References Cited

U.S. PATENT DOCUMENTS

| | | | |
|---|---|---|---|
| 8,327,238 B2 * | 12/2012 | Gorobets | G06F 11/1068 714/782 |
| 8,756,464 B2 | 6/2014 | Kim et al. | |
| 2003/0074619 A1 | 4/2003 | Dorsey | |
| 2006/0120166 A1 * | 6/2006 | Kim | G11C 16/10 365/185.33 |
| 2006/0282747 A1 * | 12/2006 | Hummler | G11C 29/42 714/763 |
| 2008/0016430 A1 * | 1/2008 | Yoshida | G06F 11/1068 714/764 |
| 2011/0205654 A1 * | 8/2011 | Sakurai | G11B 20/1833 360/31 |

OTHER PUBLICATIONS

Hsiao, A Class of Optimal Minimum Odd-weight-column SEC-DED Codes, UC Berkeley, Jul. 1970. pp. 395-401.*

Chen, et al. "Error-Correcting Codes for Semiconductor Memory Applications: A State-of-the-Art Review." IBM J Res Develop, vol. 28, No. 2, Mar. 1984.

* cited by examiner

US 9,818,492 B2

METHOD FOR TESTING A MEMORY AND MEMORY SYSTEM

REFERENCE TO RELATED APPLICATION

This application claims priority to German application No. 10 2013 211 077.4 filed on Jun. 13, 2013.

DESCRIPTION

Embodiments of the present disclosure relate to a method for testing a memory by performing an error correction code check. Further embodiments of the present disclosure relate to a memory system comprising a controller which is configured to test a memory of the memory system.

BACKGROUND

SRAM memories in complicated micro controller products have to be tested frequently in safety applications during the application in order to detect, to correct and to register resulting new hard errors and soft errors in the memory. This is executed in short regular time slices and takes a substantial amount of time of the actual application. The shorter the time required for regularly testing the memory, the more time and performance is available for the actual application.

In conventional systems, SRAM modules are tested by first of all functionally switching off modules whose SRAM was to be tested and then making the memory accessible via the bus and then transferring (copying) the actual application content into a different memory which is still empty and then testing the memory to be tested using a predefined algorithm/physical occupation. After the test, the actual content is copied back again.

Shifting the original user data via a bus is very time-consuming. Likewise, the test frequently executed by the CPU is often not really able to simulate critical conditions during active operation as the CPU accesses the memory via a slow bus with waiting cycles during the test while the module which uses the memory possibly accesses each cycle one after the other.

SUMMARY

The present disclosure provides an improved method for testing a memory and an improved memory system.

Embodiments of the present disclosure relate to a method for testing a memory. The method comprises performing an error correction code check (ECC check) on user data stored in the memory, and inverting the user data stored in the memory. The method further comprises performing a further ECC check on the inverted user data stored in the memory, and inverting the inverted user data stored in the memory for restoring the user data in the memory.

Furthermore, further embodiments of the present disclosure relate to a memory system comprising a memory having stored thereon user data and a controller. The controller is configured to test a memory by performing an error correction code check (ECC check) on the user data stored in the memory, and inverting the user data stored in the memory. The controller is further configured to test the memory by performing a further ECC check on the inverted user data stored in the memory, and inverting the inverted user data stored in the memory for restoring the user data in the memory.

BRIEF DESCRIPTION OF THE DRAWINGS

Embodiments of the present disclosure will be described in more detail using the accompanying figures, in which.

DETAILED DESCRIPTION

Before embodiments of the present disclosure are described in more detail, it should be pointed out that in the figures elements having the same or equal functionalities are provided with the same reference numbers. Hence, descriptions provided for elements having the same reference numbers are mutually exchangeable.

Figure 1:
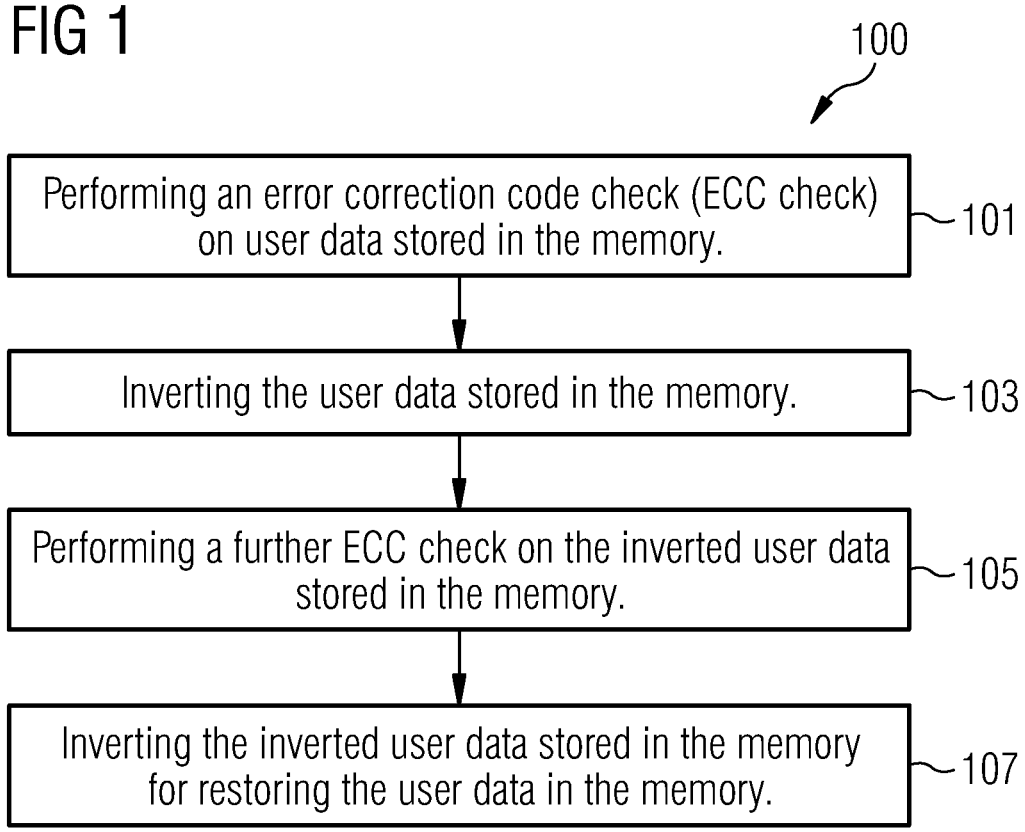
FIG. 1 shows a flow diagram of a method for testing a memory according to an embodiment of the present disclosure.

FIG. 1 shows a flow diagram of a method 100 for testing a memory.

The method 100 comprises performing an error correction code check (ECC check) on user data stored in the memory at 101.

Furthermore, the method 100 comprises inverting the user data stored in the memory at 103.

Furthermore, the method 100 comprises performing a further ECC check on the inverted user data stored in the memory at 105.

Furthermore, the method 100 comprises inverting the inverted user data stored in the memory for restoring the user data in the memory at 107.

The method 100 may be a non-destructive test for SRAM in applications.

The inventors have found that a very fast test of a memory can be implemented, if a first ECC check is performed on user data stored in a memory and a second ECC check is performed on an inverted version of the user data stored in the memory. It is an advantage of this procedure that on the one hand so called hard stuck-at errors can be found due to the performing of the first ECC check on the user data as stored in the memory and the further ECC check on the inverted user data. Furthermore, by inverting the user data twice, it can be ensured that no copying of the user data to another memory is necessary, as the content of the user data is maintained although the ECC checks are actually performed on the user data (which may part of a program code of an application). Hence, in contrast to conventional systems no predetermined error pattern has to be copied to the memory on which the ECC checks are performed and no copying of the user data (such as program codes or other user dependent data) currently stored in the memory to another (safety) memory has to be performed.

Figure 2:
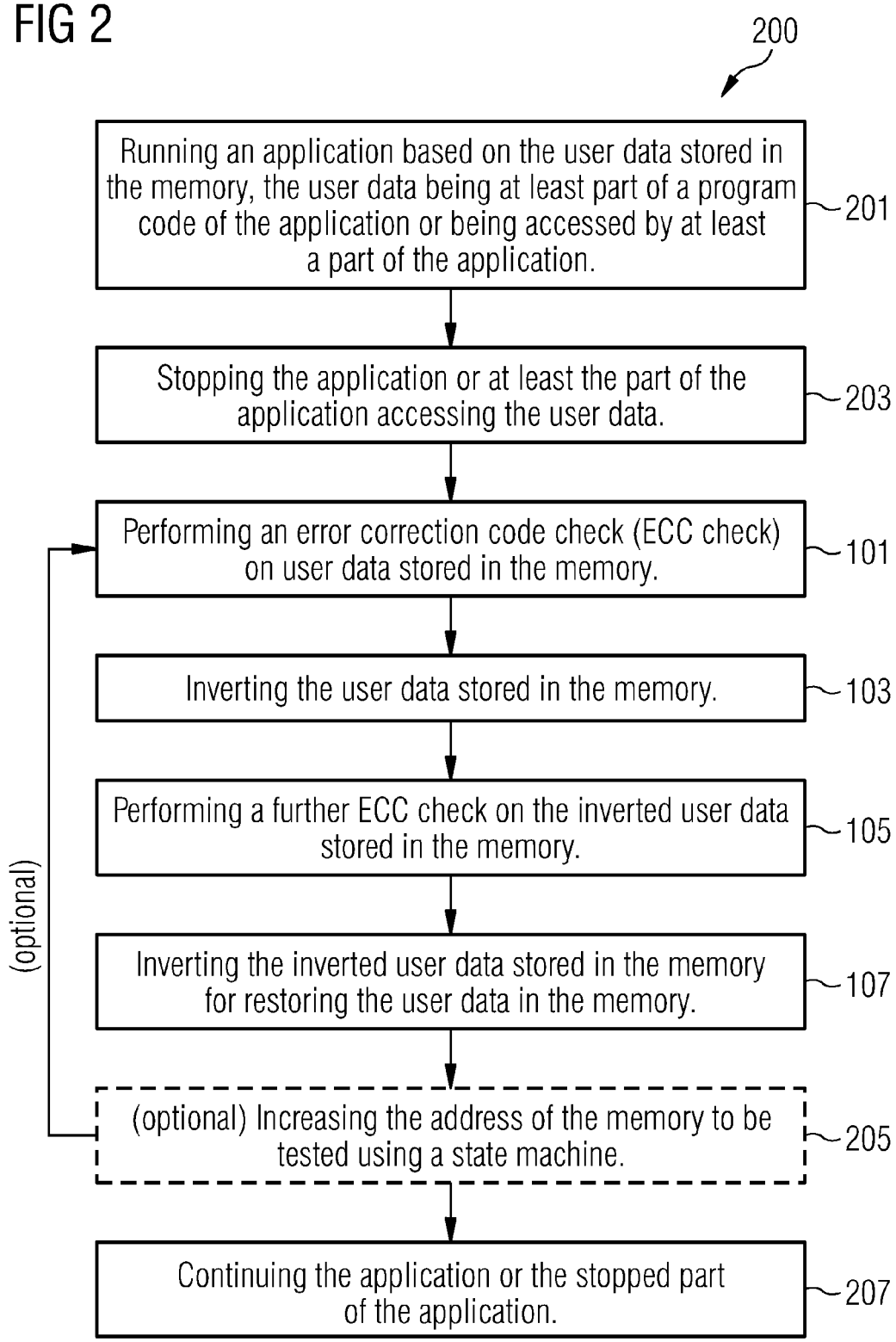
FIG. 2 shows another flow diagram of a further method for testing a memory according to an embodiment of the present disclosure which is a possible implementation of the method shown in FIG. 1.

During the test of the memory one address of the memory can be tested at a time, as this is also shown in conjunction with FIG. 2. Hence, one address can be tested at a time (read the user data from the address and ECC test it while reading, then invert it and write it back right away, then read and ECC test the inverted user data, invert the inverted user data and write it back to the address) and only then the next address is tested, on which the same acts of reading and inverting twice are performed with the user data stored at this next address.

However, according to further embodiments also all addresses (or at least a certain address range of the memory) can be read and the ECC check can be performed at once for the complete addresses read. Then all user data stored at this addresses can be inverted and the further ECC test is performed on the inverted user data stored at these (plurality of) addresses. Afterwards the inverted user data is inverted and written back to these addresses of the memory.

The concept of testing all addresses (or at least a certain address range) of the memory has the advantage that the test moves faster over the data (which is even better in some ways) without writes in between.

Another advantage is that the method 100 can be easily implemented using an (usually already available) memory built in self-test controller (MBIST controller) in conjunction with an (usually already available) error correction check unit or controller (ECC controller).

Figure 3:
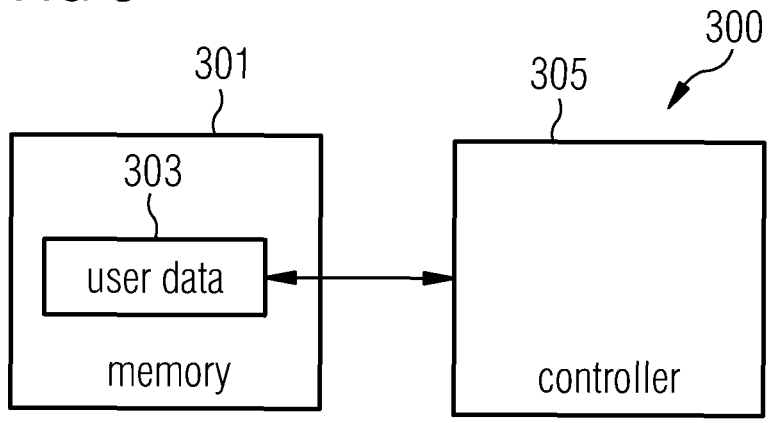
FIG. 3 shows a block diagram of a memory system according to an embodiment of the present disclosure.

FIG. 3 shows such a memory system 300 comprising a memory 301. The memory 301 (which may be an SRAM) has stored thereon user data 303. Furthermore, the memory system 300 comprises a controller 305. The controller is configured to test the memory 301 by, performing a (first) error correction code check (ECC check) on the user data 303 stored in the memory 301, inverting the user data 303 stored in the memory 301 (after the ECC check has been performed), performing a (second or) further ECC check on the inverted user data (now) stored in the memory 301 and inverting the inverted user data stored in the memory 301 for restoring the user data 303 in the memory 301 (after the further ECC check has been performed). Hence the controller 305 is capable of testing the memory 301 without any need for copying the user data 303 to a safety memory, maintaining the user data 303 and even finding hard stuck-at errors (due to the principle of inverting twice).

In other words, if user data is used for testing, the user data cannot be influenced like in a normal test (in which certain test patterns are used) to have both polarities. Hence bit errors would hide behind the user data if the stuck-at error is of the same polarity like the user data for each bit. Hence the principle of inverting twice allows to test for both polarities, without destroying the user data.

Figure 4:
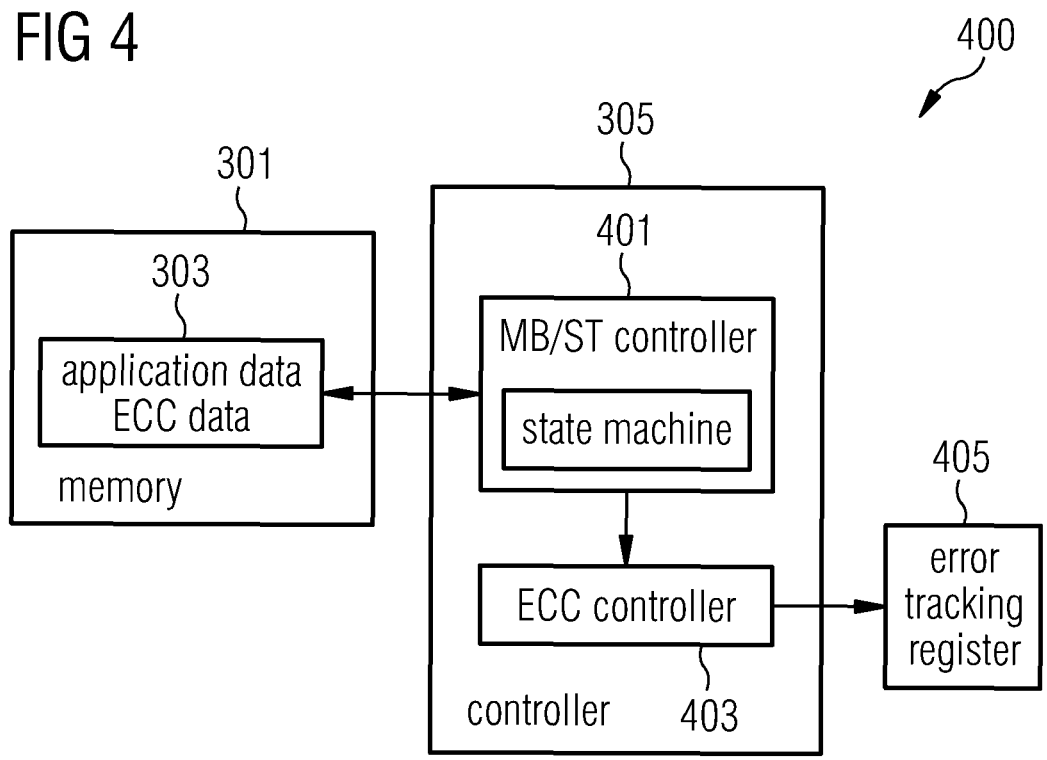
FIG. 4 shows a block diagram of a further memory system according to an embodiment of the present disclosure, which is a possible implementation of the memory system shown in FIG. 3.

A possible implementation of the controller 305 is shown in FIG. 4 of the present application showing a memory system 400 as a possible implementation of the memory system 300 shown in FIG. 3. As can be seen, the controller 305 of the memory system 400 comprises the mentioned MBIST controller 401 and the ECC controller 403.

The MBIST controller 401 is configured to read the user data 303 and the inverted user data from the memory 301.

Furthermore, the MBIST controller 401 is configured to write the inverted user data to the memory 303 and to rewrite the user data 303 (in the original and not inverted version) back into the memory 301 (after the further ECC check has been performed). The ECC controller 403 is configured to perform the ECC check on the user data 303 read from the memory 301 by the MBIST controller 401 and to perform the further ECC check on the inverted user data read from the memory 301 by the MBIST controller 401.

Furthermore, as seen from FIG. 4, the memory system 400 comprises an error tracking register 405. This error tracking register 405 is typically part of surrounding logic of the memory system 400 or may be also part of the MBIST controller 401. In such an error tracking register 405 erroneous addresses or user data words are marked or stored.

The ECC controller 403 is configured to, during performing the ECC check and the further ECC check correct errors found in the user data 303 or to at least mark them as errors in the error tracking register 405. As an example, hard errors, such as stuck-at errors and other non-correctable errors can be marked in the error tracking register 405, while (correctable) soft errors can be corrected by the ECC controller 403 before the inversion of the inverted user data by correcting the error in the inverted user data (e.g by performing a simple bit flip of the concerned bit). Hence the user data restored in the memory will be free of (correctable) soft errors.

Hence, according to a further embodiment soft errors which are correctable are removed to not accumulate further into multiple errors when not fixing them.

Nevertheless, this correction of soft errors can also be omitted as it would be sufficient to mark also this (correctable) soft errors in the error tracking register 405 (which can be performed by further embodiments of the present disclosure), as applications accessing the memory would anyway check the error tracking register 405 for errors in the memory. Hence, according these embodiments, the restored user data may still comprise the (correctable) soft errors but which are marked in the error tracking register 405.

Embodiments of the present disclosure use the MBIST controller 401 which may be present for testing purposes anyway after manufacturing. Further, for reliability purposes it uses the (typically anyway existing) ECC controller 403 (also designated as ECC detection and correction unit). The ECC controller 403 corrects or shows one-bit and two-bit errors during the operation. The ECC controller 403 together with the MBIST controller 401 form the controller 305 and, as has been found by the inventors, are ideal in combination for an online testing during the application.

For normal test purposes, the MBIST controller 401 in any case allows a fast write and read access to the memory 301 and the ECC controller 403 is ideal to detect possible errors for any data words. In order to prevent time consuming copying of the user code or user data 303, as it is performed in conventional systems, the MBIST controller 401 may now run to read across the complete memory content of the memory 301 and uses the ECC controller 403 to find errors possibly contained therein and then find and register erroneous words, e.g. in an error tracking register 405 in which the addresses of erroneous words are stored. This error tracking register 405 or error tracking memory 405 can be, for example, used as a kind of mini cache during testing the memory 301 to mask by means of a software installation after every boot cycle the erroneous SRAM words in this mini cache.

The inventors found that by only checking the user data 303 as is stored on the memory 301 so called hard stuck-at errors may not be found, as the error may have the same polarity as the user bit at this position. This is why with a normal MBIST test several tests with different data content and polarities are run across a memory to still find these errors. As the user data 303 is not predictable or does not follow a certain scheme and especially should be maintained in the memory 301, this principle is of course not possible with the user data 303. This is why embodiments of the present disclosure make use of the finding that the problem of hard stuck-at errors can be found when a first ECC check is performed on the user data and a further ECC check is performed on the inverted user data. Hence, embodiments of the present disclosure invert the complete user word when reading and in the next cycle writes it back into the memory 301. This can be executed for all words in the memory 301 in the first run. Here, all errors of a certain polarity can be simultaneously found by the ECC controller 403. Now, the procedure is started a second time using the completely inverted memory content (the inverted user data) and again all now inverted words are read out using the MBIST controller 401 and the ECC controller 403 is again used for error detection and inverts the word for each address and writes it back in a fully inverted way. After the second run now the original content of the memory (the original user data 303 as stored in the memory 301 before performing the first ECC check) has been reproduced and still all hard and soft one- and two-bit errors and depending on the algorithm even all three-bit stuck at errors have been found (errors having both polarities) and the memory content has thus been completely obtained. Hence, after performing the two error correction code checks on the user data 303 and the inverted user data the content of the memory 301 is still maintained as the user data has not been changed. Hence, troublesome and time consuming copying of the content of the memory 301 is no longer necessary as it is performed by conventional systems. Each address is thus read exactly twice and written twice. More time than that is not necessary and a very fast testing is possible (e.g. a lot faster than across a slow bus via a CPU) and hardware, area and power existing anyway for other purposes can be used for performing the test according to the method 100. This procedure is ideal for frequent regular testing of memories during the application.

From FIG. 4 it can be seen that the user data 303 may comprise application data and ECC data. The ECC data is typically directly derived from the application data based on a certain ECC code. In embodiments of the present disclosure the ECC data can is on a symmetrical ECC code such that in the case of an error free memory a result of the ECC check on the user data (which should be error free) and a result of the further error check on the inverted user data are equal.

In other words, embodiments of the present disclosure use an ECC code which is symmetrical for the described non-destructive test. Such an invertible code leads to the same result (single fault, double fault) with both polarities. The ECC code should have the characteristic that each codeword when inverted bit-wise again becomes a codeword. This is possible by a skillful selection of the code and a possible extension by one-bit, if required.

By inverting all bits stuck at failures with any kind of user code/data (that we cannot influence compared to a normal MBIST test pattern) can be found. Hence using the symmetrical ECC code gives the possibility to invert the complete user data, which enables to find also these stuck-at faults which are there but not detectable (without inversion) due to a masking of user data of the same polarity as the fault.

An example for such a symmetrical ECC code is the symmetrical shortened Hsiao ECC code. Hence, at least some embodiments of the present disclosure use the symmetrical shortened Hsaio ECC code based on which the ECC check and the further ECC check are performed.

FIG. 2 shows a flow diagram of a method 200 for testing a memory according to an embodiment of the present disclosure. The method 200 shown in FIG. 2 is a more detailed example of the method 100 comprising additional acts.

The method 200 shows how during the normal run of an application a test of the memory which comprises user data 303 which is part of a program code of the application can be tested.

The method 200 comprises running an application based on the user data (e.g. the user data 303) stored in the memory 301, wherein the user data 303 is at least part of the program code of the application or the user data 303 is accessed by (at least a part of) the application at 201.

In a further act of the method 200 the application is stopped at 203 or at least the part of the application is stopped which accesses the part (address or address range) of the memory which is to be tested before the (first) ECC check is performed on the user data 303 at 101. After the application is stopped or at least partly stopped the acts 101 to 107 (of method 100) are performed on the user data 303 to test the memory 301 at the address or addresses at which the user data 303 is stored in the memory 301. Or in other words: It is not necessary to completely shut down the application as it is sufficient to stop the core/peripheral which executes out from such address or addresses of the memory 301 or SRAM to be tested or to make the core perform some other application from some other physical SRAM or other address of the memory 301 not to be tested and then setup the test and start and run it.

As already described, during performing the first error correction code check at 101 on the user data 303 the user data 303 can is read using the MBIST controller 401 and checked by the ECC controller 403.

Furthermore, during the inverting the user data stored in the memory at 103 the inverted user data is written into the memory using the MBIST controller 401. It has been found by the inventors that such an MBIST controller 401 can be easily used for reading user data 303 from a memory 301 and for writing the user data 303 in an inverted version back to the memory 301 without the need for a time consuming copying of the user data 303 to another (e.g. separate) memory.

Furthermore, during performing the further (or second) ECC check at 105, the inverted user data is read using the same MBIST controller 401. The inverted user data is then checked for errors using the ECC controller 403 at 105.

Furthermore, during inverting the inverted user data at 107, the user data is rewritten into the memory using the MBIST controller 401. Hence, after the first error correction code check and the second error correction code check in which the above mentioned soft errors and hard errors in the user data 303 are found and eventually even corrected, the memory content is retained without the need for any time consuming copying of the user data.

Errors found by the ECC controller 403 at acts 101 and 105 are corrected or at least marked (or registered) in the error tracking register 405. Typically a software or application accesses the error tracking register 405 and deals with the marked errors and may even decide, if such errors are correctable.

According to further embodiments, also a masking of the errors found can happen by means of the error tracking register 405, such that an access to the faulty words in the memory is masked and available redundancy data is used.

Furthermore, at 103 the inverted user data can be written to the same address in the memory 301 where the user data 303 was read from at 101. Furthermore, at 107 the user data 303 is rewritten into the same address in the memory 301 where the user data 303 (and the inverted user data) was read from.

Furthermore, the user data 303 is typically stored at a predetermined address or address range of the memory 301 to be tested For a test of the complete memory 301 (all addresses or the complete address range of the memory 301) the acts 101, 103, 105 and 107 are be repeated for a plurality of further addresses or address ranges of the memory 301 to be tested.

In other words, typically the user data 303 tested in one cycle of subsequent acts 101, 103, 105 and 107 is associated to a certain address or address range of the memory 301. After having tested this address or address range the address of the memory 301 to be tested can be increased (e.g. using a state machine in the MBIST controller 401), after inverting the inverted user data at 107.

Hence, the method 200 may comprise an optional act of increasing the address of the memory to be tested using a state machine at 205. To summarize, the controller 305 can be configured to subsequently test different addresses of the (same) memory.

The MBIST controller 401 can be further configured to read the user data 303 from a predetermined address in the memory 301, to write the inverted user data to the predetermined address, to read the inverted data from the predetermined address and to rewrite the user data 303 to the predetermined address. Hence, as already described above, the acts 101 to 107 performed subsequently are performed on the same address of the memory 301. After these acts 101 to 107 have been performed and the memory 301 is tested at the predetermined address, the MBIST controller 401 may increase the address of the memory 301 to be tested. For this the MBIST controller 401 may comprise the above mentioned state machine for increasing the address after the user data 303 was rewritten to the predetermined address. After the increasing of the address of the memory 301 to be tested the controller 305 can restart the test of the memory 301 for the increased address of the memory 301 such that the acts 101, 103, 105 and 107 are performed again on the increased address of the memory 301 This procedure may be repeated until all addresses of the memory 301 have been tested.

After all addresses of the memory 301 have been tested or at least after all addresses have been tested at which user data 303 is stored which is part of the program code of the application or which are accessed by the application or the stopped part of the application, the application or the stopped part of the application can be continued. Hence, the user data does not necessarily need be part of a program code of the application, but can also be more complex data (as a program code usually can be reloaded from non volatile Memory while such data may not) which is accessed by the application.

Hence, the method 200 comprises continuing the application at 207.

During the acts 101 and 105 of performing the ECC check and the further ECC check, the ECC controller 403 can be configured to correct errors found in the user data 303 (and in the inverted user data) as stored on the memory 301 or to at least (if the errors cannot be corrected, e.g. as stuck at errors) mark these errors in the error tracking register 405.

Furthermore, as already described instead of using certain error patterns based on which the ECC check and the further ECC check are performed, the user data 303 as stored in the memory 301 is used for performing the ECC check and the further ECC check. Hence, there is no need for copying the user data to another memory or another region of the memory and to write a certain error pattern to the region in which the user data 303 is stored in the memory 301. Hence, in contrast to conventional systems in which such a special error pattern is used for performing the ECC check, a content of the memory 301 is maintained (and not replaced with a certain error pattern) before performing the ECC check on the user data 303 stored in the memory. Hence, the ECC check and the further ECC check can be performed on user data 303 based on which application ran before the ECC checks were performed and based on which the application is continued after the memory is tested. It is to be pointed out that for several tests of the memory the user data 303 may change, as the user data 303 is user (or application) dependent and independent from the ECC checks.

Embodiments of the present disclosure therefore implement a twice time inverting (of the user data 303) when reading and a subsequent immediate inverted write-back. Furthermore, embodiments of the present disclosure can make use of an existing MBIST controller 401 and an existing ECC controller 403 and user code/user data for the online test during the application with a full user data acquirement and without swapping out or swapping in the user data. Furthermore, embodiments of the present disclosure enable the finding of hard and soft one-, two- and three-bit errors and optionally may also enable a correction of soft errors, for example by additional software and error tracking registers, such as the error tracking register 405 which may anyway exist in safety applications.

In contrast to the concept of copying user data and user code a very fast test can be achieved, as no swapping or copying of the user data is needed at all. Embodiments of the present disclosure are therefore ideal for safety applications with a frequent testing of the memory during the application for acquiring a normal CPU performance. Furthermore, according to some embodiments of the present disclosure an invertible symmetrical ECC code is used which, when inverting data word and codeword, leads to the same result in the ECC controller or ECC decoder 403 (for single fault and double fault).

The functionality of the memory system 400 and of the methods 100 and 200 can be summarized as the following. The MBIST controller 401 controls the memory 301 using the state machine (as an example, a counter would be a simple implementation to generate consecutive addresses at the memory) and the ECC controller or ECC decoder 403 detects errors during reading the memory 301 (the user data 303 from the memory 301). Erroneous addresses are written into the error tracking register 405. Furthermore, the user data is inverted and written back. This process of reading and inverted writing is to be repeated so that in the end the original data (the original user data 303) is stored in the memory 301. As an example, symmetrical shortened Hsiao ECC code is advantageous to detect both polarities of errors and with any given user data. Hence, embodiments of the present disclosure may implement such a symmetrical shortened Hsiao ECC code.

Furthermore, the user data (e.g. program code or user specific stored data) are preserved, without the need for swapping the user data before testing the memory. Hence, the test is very fast as one does not have to move user data/code to another place first and then test it. Hence, embodiments enable a full speed hardware test with no big setup tasks before and after test by moving user data back and forth and by not loosing full speed test (which is important for finding failures which only show up in the application at full speed) with using only software test in the application. In other words, in embodiments of the present disclosure the memory is read as fast as in the normal application which enables that even the failures are found which only show up with full speed, back to back as fast as the normal application accesses. This would not be possible via the bus from a central controller and is enabled by embodiments of the present disclosure using the MBIST controller which allows full speed access as fast as normal application or surrounding hardware.

According the further embodiments the methods 100, 200 may be extended by further ECC tests of the memory to achieve an even higher test coverage. As an example the methods may comprise inverting every even bit of the user data, performing a third ECC check on the user data with inverted even bits, and inverting the user data with inverted even bits for restoring the user data in the memory. The method further comprises inverting every odd bit of the user data, performing a fourth ECC check on the user data with inverted odd bits, and inverting the user data with inverted odd bits for restoring the user data in the memory.

Here it does not matter if the odd bits or the even bits are inverted and tested first.

Hence, also further test neighboring relationships (like normal MBIST test do with various patterns) are possible as described e.g. by inverting only every second bit (even), performing the ECC check and then inverting back and then doing the same on every other bit (odd). This improves the coverage even further to not just find simple stuck-at errors, but also more complex neighboring relationship (e.g. influenced by Crosstalk or with capacitance or shortages between bits, etc.). Hence, in this case 4 runs are performed (complete inversion twice, then only inverting even bits twice and then only inverting odd bits twice).

Further this concept can be extended based on the principle of performing a twice time inversion of the user data or of parts of the user data.

In other words, this can certainly be refined further with more runs (still much faster and non destructive), e.g. like inverting only every second word completely and inverting back. Hence, an almost as good coverage as very simple real test patterns can be achieved. Furthermore more errors can found than with simple SCAN tests.

The methods 100, 200 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method act or a feature of a method act. Analogously, aspects described in the context of a method step also represent a description of a corresponding block or item or feature of a corresponding apparatus. Some or all of the method acts may be executed by (or using) a hardware apparatus, like for example, a microprocessor, a programmable computer or an electronic circuit. In some examples, some one or more of the most important method acts may be executed by such an apparatus.

Depending on certain implementation requirements, examples can be implemented in hardware or in software. The implementation can be performed using a non-transitory digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples can be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the example method is, therefore, a computer program having a program code for performing one of the methods described herein, when the computer program runs on a computer.

A further implementation of the example method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further implementation of the example method is, therefore, a data stream or a sequence of signals representing the computer program for performing one of the methods described herein. The data stream or the sequence of signals may, for example, be configured to be transferred via a data communication connection, for example, via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, in one embodiment the methods are performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

The invention claimed is:

1. A method for testing a memory, the method comprising:
performing an error correction code check (ECC check) on user data stored in the memory;
inverting the user data stored in the memory to obtain inverted user data stored in the memory;
performing a further ECC check on the inverted user data stored in the memory;
inverting the inverted user data stored in the memory for restoring the user data in the memory;

inverting even bits of the user data stored in the memory to obtain user data with inverted even bits stored in the memory;
performing a third ECC check on the user data with inverted even bits stored in the memory;
inverting even bits of the user data with inverted even bits stored in the memory for restoring the user data in the memory;
inverting odd bits of the user data stored in the memory to obtain user data with inverted odd bits stored in the memory;
performing a fourth ECC check on the user data with inverted odd bits stored in the memory; and
inverting odd bits of the user data with inverted odd bits stored in the memory for restoring the user data in the memory.

2. The method according to claim 1, further comprising:
running an application based on the user data stored in the memory, the user data being at least part of a program code of the application or being accessed by at least a part of the application.

3. The method according to claim 2,
wherein the application is stopped before the ECC check is performed on the user data or at least the part of the application is stopped which accesses the user code before the ECC check is performed on the user data; and
wherein the application or the stopped part of the application is continued after the user data is restored.

4. The method according to claim 1,
wherein the user data comprises application data and ECC data, wherein the ECC data is based on a symmetrical ECC code such that in the case of an error free memory a result of the ECC check on the user data and a result of the further ECC check on the inverted user data are equal.

5. The method according to claim 1,
wherein the user data comprises application data and ECC data, wherein the ECC data is based on a symmetrical shortened Hsiao ECC code.

6. The method according to claim 1,
wherein during performing the ECC check, the user data is read using a memory-built-in-self-test controller (MBIST controller);
wherein during inverting the user data the inverted user data is written into the memory using the MBIST controller;
wherein during performing the further ECC check the inverted user data is read using the MBIST controller; and
wherein during inverting the inverted user data the user data is rewritten into the memory using the MBIST controller.

7. The method according to claim 6,
wherein the inverted user data is written to the same address in the memory where the user data was read from; and
wherein the user data is rewritten into the same address in the memory, where the user data was read from.

8. The method according to claim 1,
wherein the user data is stored at a predetermined address of the memory which is to be tested; and
wherein performing of the error correction code check, inverting of the user data, performing of the further ECC check and inverting of the inverted user data are repeated for a plurality of further addresses of the memory to be tested.

9. The method according to claim 8, further comprising:
increasing the address of the memory to be tested using a state machine, after the inverting of the inverted user data.

10. The method according to claim 1,
wherein a content of the memory is maintained before performing the ECC check on the user data stored in the memory.

11. The method according to claim 1,
wherein during performing the ECC check and the further ECC check errors found in the user data as stored on the memory are corrected or at least marked in an error tracking register.

12. A memory system, comprising:
a memory having stored therein user data; and
a controller;
wherein the controller is configured to test the memory by:
    performing an error correction code (ECC) check on the user data stored in the memory;
    inverting the user data stored in the memory to obtain inverted user data stored in the memory;
    performing a further ECC check on the inverted user data stored in the memory;
    inverting the inverted user data stored in the memory for restoring the user data in the memory;
    inverting even bits of the user data stored in the memory to obtain user data with inverted even bits stored in the memory;
    performing a third ECC check on the user data with inverted even bits stored in the memory;
    inverting even bits of the user data with inverted even bits stored in the memory for restoring the user data in the memory;
    inverting odd bits of the user data stored in the memory to obtain user data with inverted odd bits stored in the memory;
    performing a fourth ECC check on the user data with inverted odd bits stored in the memory; and
    inverting odd bits of the user data with inverted odd bits stored in the memory for restoring the user data in the memory.

13. The memory system according to claim 12,
wherein the controller comprises a memory-built-in-self-test (MBIST) controller and an ECC controller;
wherein the MBIST controller is configured to read the user data and the inverted user data from the memory; and
wherein the ECC controller is configured to perform the ECC check on the user data read from the memory by the MBIST controller and to perform the further ECC check on the inverted user data read from the memory by the MBIST controller.

14. The memory system according to claim 13,
wherein the controller is configured to subsequently test different addresses of the memory; and
wherein the MBIST controller is further configured to read the user data from a predetermined address in the memory, to write the inverted user data to the predetermined address, to read the inverted user data from the predetermined address and to rewrite the user data to the predetermined address.

15. The memory system according to claim 14,
wherein the MBIST controller further comprises a state machine for increasing the address after the user data was rewritten to the predetermined address; and wherein the controller is configured to perform the error correction code check, the inverting of the user data, the further ECC check and the inverting of the inverted user data on user data stored at the increased address in the memory.

16. The memory system according to claim 12, wherein the user data is part of a program code of an application stored on the memory.

17. The memory system according to claim 12, wherein the user data comprises application data and ECC data, wherein the ECC data is based on a symmetrical ECC code such that in the case of an error free memory a result of the ECC check on the user data and a result of the further ECC check on the inverted user data are equal.

18. A memory system, comprising:
a memory having stored therein user data, the user data being part of a program code of an application stored on the memory;
a memory-built-in-self-test (MBIST) controller; and
an error correction code (ECC) controller;
wherein the MBIST controller is configured to read the user data from a predetermined address of the memory a first time, invert the user data, write the inverted user data to the predetermined address of the memory, read the inverted user data from the predetermined address of the memory, invert the inverted user data, rewrite the user data to the predetermined address of the memory a first time, read the user data from the predetermined address of the memory a second time, invert even bits of the user data, write the user data with inverted even bits to the predetermined address of the memory, read the user data with inverted even bits from the predetermined address of the memory, invert the even bits of the user data with inverted even bits, rewrite the user data to the predetermined address of the memory a second time, read the user data from the predetermined address of the memory a third time, invert odd bits of the user data, write the user data with inverted odd bits to the predetermined address of the memory, read the user data with inverted odd bits from the predetermined address of the memory, invert the odd bits of the user data with inverted odd bits, and rewrite the user data to the predetermined address of the memory a third time;

wherein the ECC controller is configured to perform a first ECC check on the user data read from the memory by the MBIST controller, to perform a second ECC check on the inverted user data read from the memory by the MBIST controller, to perform a third ECC check on the user data with inverted even bits read from the memory by the MBIST controller, and to perform a fourth ECC check on the user data with inverted odd bits read from the memory by the MBIST controller;
wherein the user data comprises application data and ECC data, wherein the ECC data is based on a symmetrical ECC code such that in the case of an error free memory a result of the first ECC check on the user data and a result of the second ECC check on the inverted user data are equal.

19. A non-transitory storage medium having stored thereon a computer program having a program code for performing, when running on a computer, a method for testing a memory, the method comprising:
performing an error correction code check (ECC check) on user data stored in the memory;
inverting the user data stored in the memory to obtain inverted user data stored in the memory;
performing a further ECC check on the inverted user data stored in the memory; and
inverting the inverted user data stored in the memory for restoring the user data in the memory;
inverting even bits of the user data stored in the memory to obtain user data with inverted even bits stored in the memory;
performing a third ECC check on the user data with inverted even bits stored in the memory;
inverting even bits of the user data with inverted even bits stored in the memory for restoring the user data in the memory;
inverting odd bits of the user data stored in the memory to obtain user data with inverted odd bits stored in the memory;
performing a fourth ECC check on the user data with inverted odd bits stored in the memory; and
inverting odd bits of the user data with inverted odd bits stored in the memory for restoring the user data in the memory.

* * * * *